US 6,549,030 B2

(12) United States Patent
Amick et al.

(10) Patent No.: US 6,549,030 B2
(45) Date of Patent: Apr. 15, 2003

(54) CLOCK INDUCED SUPPLY NOISE REDUCTION METHOD FOR A LATCH BASED CIRCUIT

(75) Inventors: Brian W. Amick, Austin, TX (US); Claude R. Gauthier, Fremont, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/918,744

(22) Filed: Jul. 31, 2001

(65) Prior Publication Data

US 2003/0025524 A1 Feb. 6, 2003

(51) Int. Cl.[7] .............................................. H03K 17/16
(52) U.S. Cl. ............................ 326/28; 326/21; 326/94; 327/379; 327/34
(58) Field of Search ............................ 326/94, 93, 95, 326/98, 21, 24, 26, 27, 28; 329/379, 34

(56) References Cited

U.S. PATENT DOCUMENTS

| 5,539,337 | A |   | 7/1996  | Taylor et al. ................. 326/94 |
|-----------|---|---|---------|---------------------------------------|
| 5,672,990 | A | * | 9/1997  | Chaw ......................... 327/176 |
| 5,852,378 | A | * | 12/1998 | Keeth ......................... 327/171 |
| 5,926,042 | A | * | 7/1999  | Talaga, Jr. .................... 327/45 |
| 6,072,346 | A | * | 6/2000  | Ghahremani ................ 327/198 |
| 6,201,431 | B1| * | 3/2001  | Allen et al. ................. 327/379 |

* cited by examiner

*Primary Examiner*—Michael Tokar
*Assistant Examiner*—Vibol Tan
(74) *Attorney, Agent, or Firm*—Rosenthal & Osha L.L.P.

(57) ABSTRACT

A method for reducing the noise associated with a clock signal for a latch based circuit has been developed. The method includes storing a charge at a pre-determined time of the clock cycle and releasing the stored charge also at a pre-determined time of the clock cycle. The charge is released onto the power grid of the system served by the clock signal in synchronization with the operation of the latch.

9 Claims, 5 Drawing Sheets

CLOCK INDUCED SUPPLY NOISE REDUCTION METHOD FOR A LATCH BASED CIRCUIT

BACKGROUND OF INVENTION

1. Field of the Invention

The invention relates generally to electronic circuitry. More specifically, the invention relates a method for reducing the noise associated with a clock signal for a latch based circuit.

2. Background Art

In all microprocessor-based systems, including, the clock circuit is a critical component. The clock circuit generates a clock signal that is a steady stream of timing pulses that synchronize and control the timing of every operation of the system. FIG. 1 shows a prior art diagram of an ideal clock signal 10. An entire clock cycle 12 includes a rising or leading edge 14 and a falling or trailing edge 16. These edges 14, 16 define the transition between the low phase and high phase of the signal.

FIG. 2 shows a block diagram of a prior art local clock signal distribution system. The clock signal 30a is input to a clock header 32 which serves to buffer the clock signal. From the header 32, the clock signal 30b is input to an edge-triggered latch 34 where it serves to trigger the latch. A latch is a memory device that is commonly used in integrated circuits. It is dependent upon a clock signal to initiate its function. Latches take input data and distribute output data during the entire clock high phase. Most data tends to be waiting at the latch by the time the clock pulses high, therefore most latches switch on the rising edge of the clock. Latches are also made to work on the clock low phase and consequently tend to switch on the falling edge of the clock. Both types of latches are commonly used in order make use of both phases of the clock for computation.

FIG. 3 shows a digital logic schematic of the prior art local clock signal distribution system as shown in FIG. 2. The clock signal 30a is input to the clock header 32. The clock header 32 includes a NAND gate 36 and an inverter 38a. Once inside the clock header 32, the clock signal 30a is one of the inputs to the NAND gate 36. The other NAND input 42 is a signal that is HIGH so that the gate 36 simply inverts the value of the clock signal 30a. This NAND input 42 is switched to LOW to turn off the clock header 32 if needed. Next, the signal 30a passes through the inverter 38a which inverts the signal back to its original value. The clock signal 30b then passes from the clock header 32 to the latch 34. Once in the latch 34, the signal 30b is split into two paths. The first path passes through one inverter 38b, and the second path passes through two consecutive inverters 38c and 38d. Each path feeds into separate control transistors 40a and 40b that control the DATA_IN 44 and DATA_OUT 46 paths of the latch 34.

Clock induced supply noise (hereafter "clock noise") problems on the system power grid are usually caused by the large amount of current that is used in clock signal distribution. This current comes from the switching transistors that are controlled by the clock signal. As these transistors switch states, the current noise spikes onto the power grid due to the current demand or "current draw" of the switching transistors. These high current demands cause noise in the system voltage supply due to voltage (IR) drops and inherent system inductance (L di/dt). A clock signal distribution circuit uses a significant amount of current in a short amount of time because the spikes occur twice per clock cycle: once on the current draw of the leading edge and once on the current draw of the falling edge of the signal. This puts the noise at a very high frequency (2× the clock frequency). This noise can cause missed timing if the power supply is too low or component failure if the power supply voltage is too high. The noise can even escape "off the chip" and affect the other components of the system.

FIG. 4 shows a graph of current draw during a clock cycle period of a latch based circuit. The circuit could use both rising edge latches and falling edge latches. The value "I" 35 represents the full value of a current draw. The value "¾ I" 37 represents 75% of the full value while the value "½ I" 39 represents 50% of the full value. The first current draw 41 of the graph represents the draw that results from the leading edge of a clock cycle (at clock cycle =0). The second current draw 43 represents the draw that results from the falling edge of the clock cycle (at clock cycle =t/2). As shown, the leading edge draw 41 is the full value ("I") of current draw. The trailing edge draw 43 is the same value of the leading edge draw 41. Also, each of the current draws 41 and 43 have a duration ("d") 45 when the value is above "½ I" 39.

A common technique to alleviate noise is adding additional power to the grid. This power is added upon sensing a voltage drop due to noise. However, such techniques only respond to noise at a much lower frequency than clock noise and also respond only to a certain threshold of noise. Consequently, a need exists for a technique that generates a response to clock noise at a synchronized frequency with the clock noise itself.

SUMMARY OF INVENTION

In some aspects, the invention relates to a method for reducing noise of a clock signal for a latch-based circuit, comprising: storing a charge upon receipt of a first signal; and dumping the charge onto a system power grid upon receipt of a second signal, wherein storing the charge and dumping the charge are synchronized with the operation of at least one latch.

In another aspect, the invention relates to a method for reducing noise of a clock signal for a latch-based circuit, comprising: step of storing a charge upon receipt of a first signal; step of dumping the charge onto a system power grid upon receipt of a second signal; and step of synchronizing storing the charge and dumping the charge with the operation of at least one latch.

Other aspects and advantages of the invention will be apparent from the following description and the appended claims.

DETAILED DESCRIPTION

Figure 1:
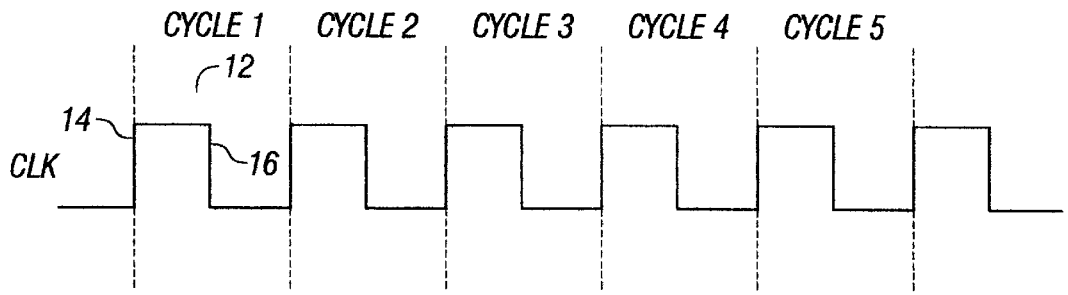
FIG. 1 shows a graph of an ideal clock signal.

Exemplary embodiments of the invention will be described with reference to the accompanying drawings. Like items in the drawings are shown with the same reference numbers.

Figure 2:
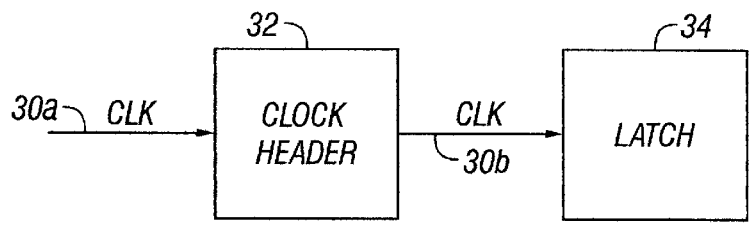
FIG. 2 shows a block diagram of a prior art embodiment of a clocking circuit for a latch.
Figure 5:
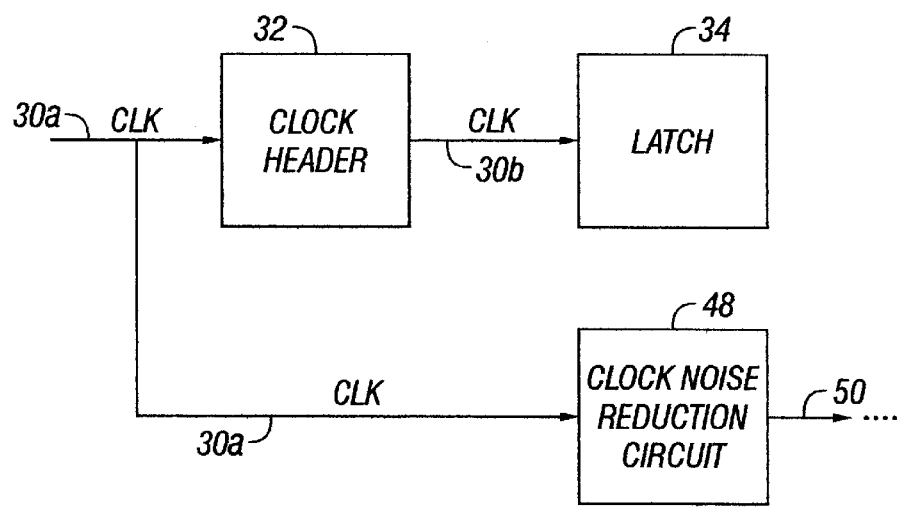
FIG. 5 shows a block diagram of a block diagram of one embodiment of the present invention.

FIG. 5 shows a block diagram of a local clock signal distribution system (similar to that shown in FIG. 2) with a clock noise reduction circuit 48 added in accordance with one embodiment of the present invention. The clock signal 30a is input to a clock header 32 which serves to buffer the clock signal. From the header 32, the clock signal 30b is input to a latch 34 where it serves to trigger the device. In this embodiment of the present invention, the initial clock signal 30a is split before the signal 30a is input into the header 32. The parallel split of the signal 30a is input into a clock noise reduction circuit 48. Upon sensing the rising edge of the clock signal 30a, the clock noise reduction circuit 48 will dump charge 50 onto the power grid of the system. The dumped charge 50 will alleviate the current noise spike associated with the clock cycle.

Figure 6:
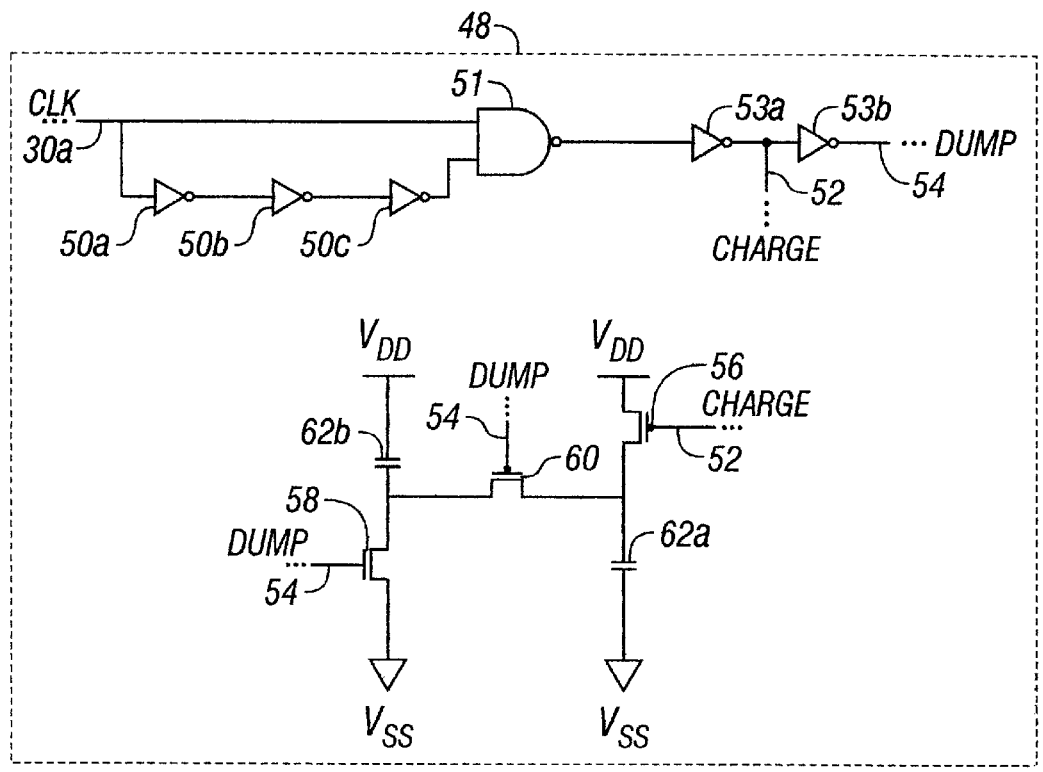
FIG. 6 shows a digital logic schematic of one embodiment of the present invention.

FIG. 6 shows a logic schematic of a clock noise reduction circuit 48 in accordance with one embodiment of the present invention. Specifically, FIG. 6 shows an embodiment of a clock noise reduction circuit that is triggered on the rising edge of the clock signal. Once inside the noise reduction circuit 48, the clock signal 30a is split into two separate branches. The first branch is directly input into a NAND gate 51. The other branch is input into a first inverter 50a that simply inverts the signal value. Next the signal is input to a second inverter 50b which inverts the signal back to its original value. Finally, the signal is input into a third inverter 50c which once again inverts the signal. The output of the third inverter 50c is then input into the second input of the NAND gate 51.

The output of the NAND gate 51 is input into to a fourth inverter 53a. This inverter 53a inverts the signal value. The signal 52 (hereafter referred to as "charge signal") is then split off into two branches. One branch of the charge signal 52 is input into a fifth inverter 53b which once again inverts the signal. The output of the fifth inverter 53b (hereafter referred to as "dump signal") is then input, along with the charge signal 52, into three circuit control transistors: a charge control transistor 56; a dump control transistor 58; and a connecting transistor 60. It is important to note that the charge signal 52 and the dump signal 54 will have opposite values because the charge signal passes through the fifth inverter 53b.

The charge control transistor 56 connects the system power supply (Vdd) with the system ground (Vss) through an charge capacitor 62a. The charge capacitor 62a is located between the charge control transistor 56 and Vss. The transistor 56 is controlled (i.e. switched on and off) with the charge signal 52. The transistor 56 is a "P-type" transistor which means that the transistor is "on" (allows current to pass) when the charge signal 52 is low. Conversely, the transistor 56 is "off" (does not allow current to pass) when the charge signal 52 is high.

The dump control transistor 58 also connects the system power supply (Vdd) with the system ground (Vss) through a dump capacitor 62b. The dump capacitor 62b is located between the dump control transistor 58 and Vdd. The transistor 58 is controlled (i.e. switched on and off) with the dump signal 54. The transistor 58 is an "N-type" transistor which means that the transistor is "on" (allows current to pass) when the dump signal 54 is high. Conversely, the transistor 58 is "off" (does not allow current to pass) when the dump signal 54 is low.

Finally, the connecting transistor 60 connects both sides of the circuit. Specifically, the connecting transistor 60 connects the sides between the control transistors 56, 58 and the respective capacitors 62a, 62b. The connecting transistor 60 is a "P-type" transistor which means that the transistor is "on" (allows current to pass) when the dump signal 54 is low. Conversely, the transistor 60 is "off" (does not allow current to pass) when the dump signal 54 is high.

In normal operation, the control circuit has two phases of operation: a charge phase and a dump phase. In each phase, the circuit is activated by an "active low" signal. The means that the respective control signal (charge 52 or dump 54) initiates its respective phase when it is low rather than high. Specifically, during the charge phase, the charge signal 52 will be low and the dump signal 54 will be high. As a result, the charge control transistor 56 and the dump control transistor 58 are both "on" while the connecting transistor 60 is "off". This allows both capacitors 62a, 62b to charge in preparation for the dump phase. During the dump phase, the charge signal 52 will be high and the dump signal 54 will be low. As a result, the charge control transistor 56 and the dump control transistor 58 are both "off" while the connecting transistor 60 is "on". This allows both capacitors 62a, 62b to dump their charge on the power grid and consequently reduce the peak current draw.

Figure 3:
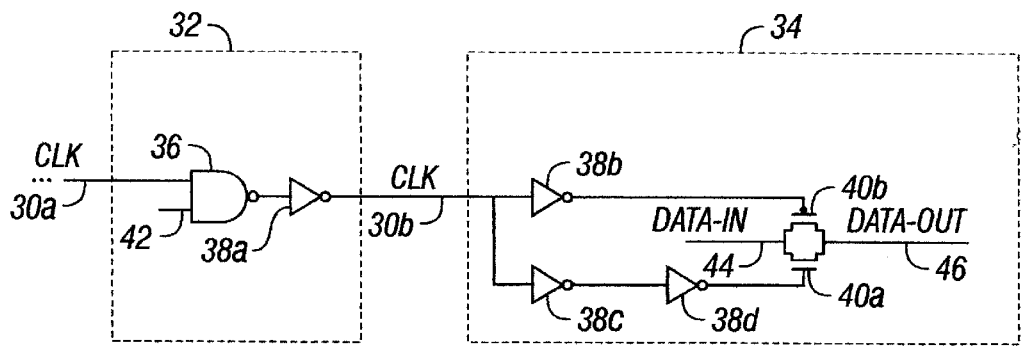
FIG. 3 shows a digital logic schematic of a prior art embodiment of a clocking circuit for a latch.

In comparing FIG. 6 with FIG. 3, it is important to note that the clock header 32 and latch 34 are synchronized with the clock noise reduction circuit 48. The header 32 and latch 34 have a three separate layers of inverters 38a, 38b, 38c, 38d along with the NAND gate 36, while the clock noise reduction circuit 48 has a total of six inverters 50a–c, 53a–c and a NAND gate 51. The components of FIG. 6 are sized such that the transistors 56, 58, and 60 are switched at the same time as the transistors 40a and 40b of FIG. 3. This causes the charge dumping to happen when data_out is being first driven by data_in in FIG. 3.

Figure 7A:
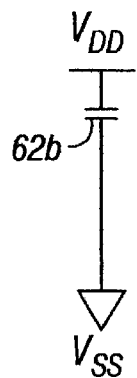
FIG. 7a shows an equivalent circuit of a portion of the digital logic schematic shown in FIG. 6 during a charge phase.
Figure 7B:
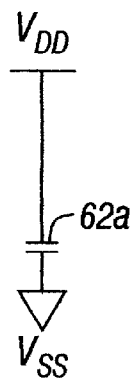
FIG. 7b shows an equivalent circuit of a portion of the digital logic schematic shown in FIG. 6 during a discharge phase.

FIGS. 7a and 7b show the equivalent circuits of a portion of the digital logic schematic shown in FIGS. 6 during a charge phase and discharge phase respectively. In each figure, the "off" transistors have been deleted while the "on" transistors have been replaced by a standard circuit connection. Specifically, FIG. 7a shows an equivalent circuit during the charge phase. It shows the two capacitors 62a and 62b connected in parallel between Vdd and Vss. FIG. 7b shows an equivalent circuit during the dump phase. It shows the two capacitors 62a and 62b connected in series between Vdd and Vss.

When the capacitors 62a and 62b are in parallel during the charge phase, the each store a charge value "Q", where Q=(Capacitance Value "C")×Vdd.

Consequently, the total charge stored by the circuit is 2Q. When the capacitors 62a and 62b are in series during the dump phase, each capacitor 62a and 62b will have a voltage equal to Vdd/2 across it. Consequently, each capacitor will store only Q/2 for a total stored charge of Q by the circuit. The excess charge will be dumped onto the power grid.

Figure 8:
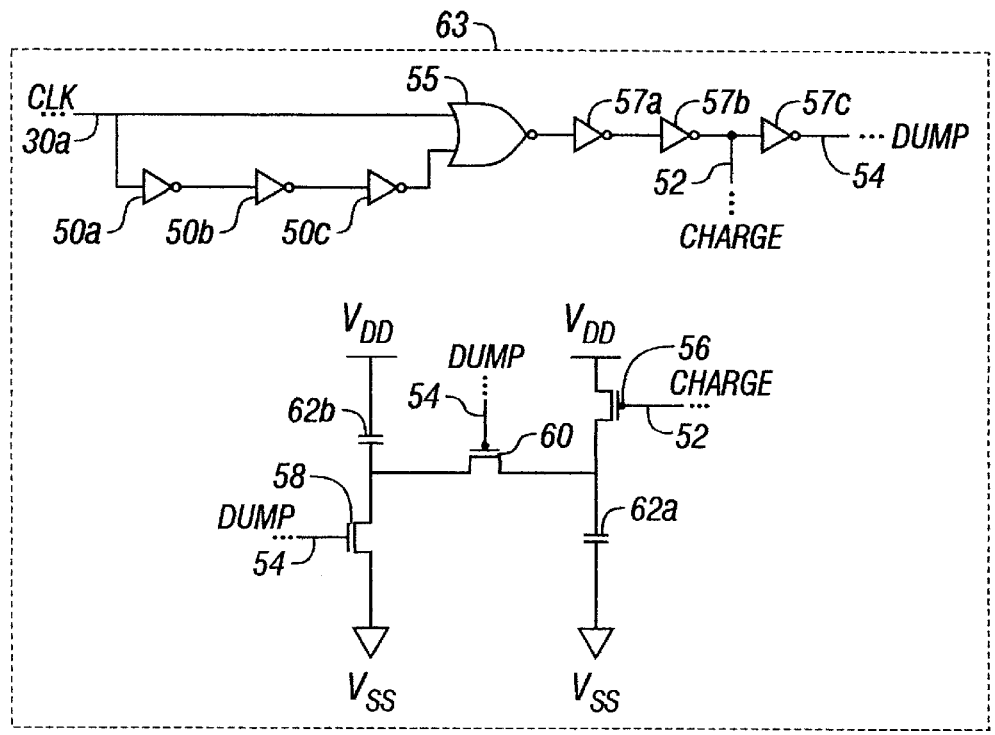
FIG. 8 shows a digital logic schematic of an alternative embodiment of the present invention.

The circuit 48 shown in FIG. 6 triggers the dump phase on the rising edge of the clock signal 30a. However, the circuit could easily be arranged to trigger the dump phase on the falling edge of the clock signal 30a. FIG. 8 shows a logic schematic of a clock noise reduction circuit 63 in accordance with one embodiment of a falling edge triggered circuit. The noise reduction circuit 63 is similar to the rising edge triggered circuit 48 shown in FIG. 6 in that is has the same configuration of the clock signal 30a splitting into two separate-branches once inside the circuit 63. However, both branches are input into a NOR gate 55. The first branch is input directly into the gate 55 with the CLK signal 30a. The second branch inputs into the gate 55 after passing the CLK signal 30a through three sequential inverters 50a, 50b, 50c.

The output of the NOR gate 55 is passed through a fourth inverter 57a and a fifth inverter 57b. The signal 52 (hereafter referred to as "charge signal") is then split off into two branches. One branch of the charge signal 52 is input into a sixth inverter 57c which once again inverts the signal. The output of the sixth inverter 57c (hereafter referred to as "dump signal") is then input, along with the charge signal 52, into three circuit control transistors: a charge control transistor 56; a dump control transistor 58; and a connecting transistor 60. Each is arranged in a similar configuration with respect to Vdd, Vss, and capacitors 62a, 62b, as the rising edge circuit 48 of FIG. 6. It is important to note that the charge signal 52 and the dump signal 54 will have opposite values because the charge signal passes through the sixth inverter 57c.

The circuit 63 will perform in a similar manner as the circuit 48 shown and described in FIGS. 6, 7a, and 7b. However, the primarily difference in the performance of the circuits shown in FIG. 6 and FIG. 8 is the dump signal 54 and the charge signal 52. As discussed previously, the dump signal for the circuit shown in FIG. 6 goes "low" during the rising edge of the CLK signal 30a and therefore initiates the dump phase on the rising edge. In contrast, the dump signal for the circuit shown in FIG. 8 goes "low" during the falling edge of the CLK signal 30a and therefore initiates the dump phase on the falling edge. As previously discussed, in each circuit the respective charge signals 52 are the inverse of their respective dump signals 54. As such, the charge phases are initiated to dump on one edge of the clock signal and recharge a short time later. The phase will not do anything during the other clock transition. The other aspects of the performance of both types of circuits are essentially the same.

Figure 9:
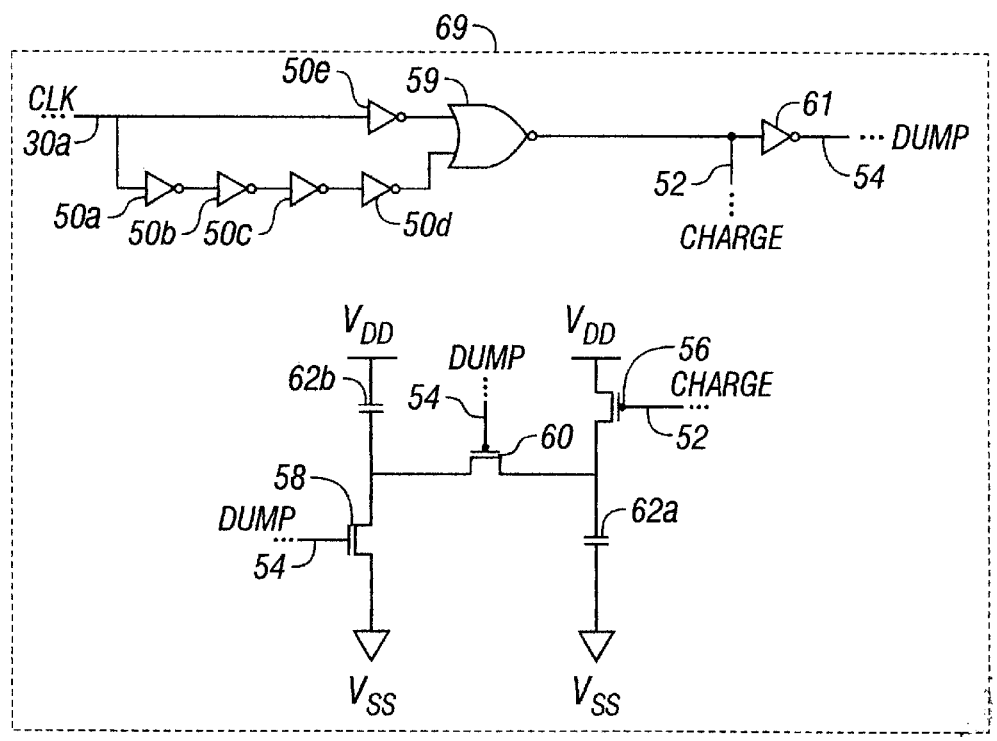
FIG. 9 shows a digital logic schematic of an alternative embodiment of the present invention.

FIG. 9 shows a logic schematic of a clock noise reduction circuit 69 in accordance with alternative embodiment of a rising edge triggered circuit. The noise reduction circuit 69 will have identical performance to the rising edge triggered circuit 48 shown in FIG. 6. The noise reduction circuit 69 is similar to the rising edge triggered circuit 48 shown in FIG. 6 in that is has the same configuration of the clock signal 30a splitting into two separate branches once inside the circuit 69. However, both branches are input into a NOR gate 59. The first branch inputs into the gate 59 after passing the CLK signal 30a through four sequential inverters 50a, 50b, 50c, and 50d. The second branch passes the CLK signal 30a through a fifth inverter 50e before being input into the gate 59.

The output of the NOR gate 59 is split off into two branches. One branch of the output 52 (hereafter referred to as "charge signal") is input into a sixth inverter 61 which once again inverts the signal. The output of the sixth inverter 61 (hereafter referred to as "dump signal") is then input, along with the charge signal 52, into three circuit control transistors: a charge control transistor 56; a dump control transistor 58; and a connecting transistor 60. Each is arranged in a similar configuration with respect to Vdd, Vss, and capacitors 62a, 62b, as the rising edge circuit 48 of FIG. 6. It is important to note that the charge signal 52 and the dump signal 54 will have opposite values because the charge signal passes through the sixth inverter 57c.

Figure 10:
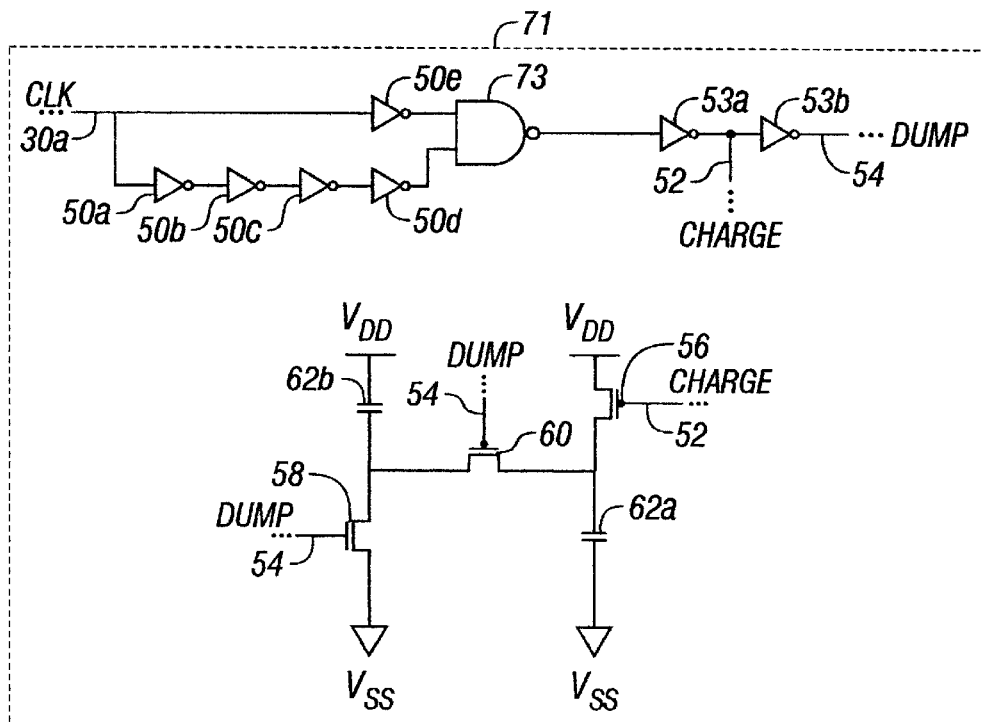
FIG. 10 shows a digital logic schematic of an alternative embodiment of the present invention.

FIG. 10 shows a logic schematic of a clock noise reduction circuit 71 in accordance with alternative embodiment of a falling edge triggered circuit. The noise reduction circuit 71 will have identical performance to the falling edge triggered circuit 63 shown in FIG. 8. The noise reduction circuit 71 is similar to the falling edge triggered circuit 63 shown in FIG. 8 in that is has the same configuration of the clock signal 30a splitting into two separate branches once inside the circuit 71. However, both branches are input into a NAND gate 73. The first branch inputs into the gate 59 after passing the CLK signal 30a through four sequential inverters 50a, 50b, 50c, and 50d. The second branch passes the CLK signal 30a through a fifth inverter 50e before being input into the gate 59.

The output of the NAND gate 51 is input into to a sixth inverter 53a. This inverter 53a inverts the signal value. The signal 52 (hereafter referred to as "charge signal") is then split off into two branches. One branch of the charge signal 52 is input into a seventh inverter 53b which once again inverts the signal. The output of the seventh inverter 53b (hereafter referred to as "dump signal") is then input, along with the charge signal 52, into three circuit control transistors: a charge control transistor 56; a dump control transistor 58; and a connecting transistor 60. Each is arranged in a similar configuration with respect to Vdd, Vss, and capacitors 62a, 62b, as the rising edge circuit 48 of FIG. 6. It is important to note that the charge signal 52 and the dump signal 54 will have opposite values because the charge signal passes through the fifth inverter 53b.

Figure 4:
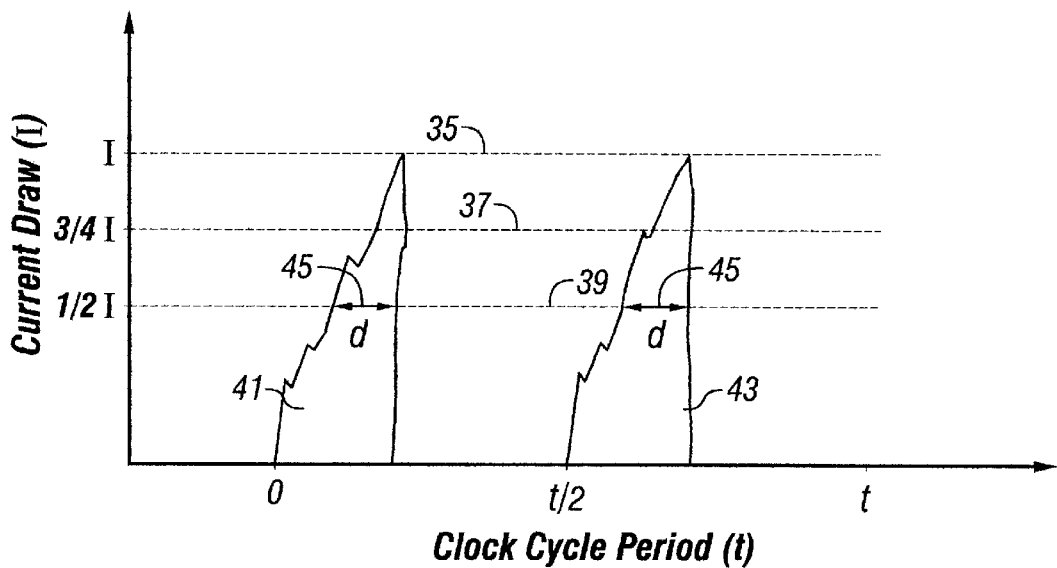
FIG. 4 shows a graph of current draw during a clock cycle period of a latch based circuit.
Figure 11:
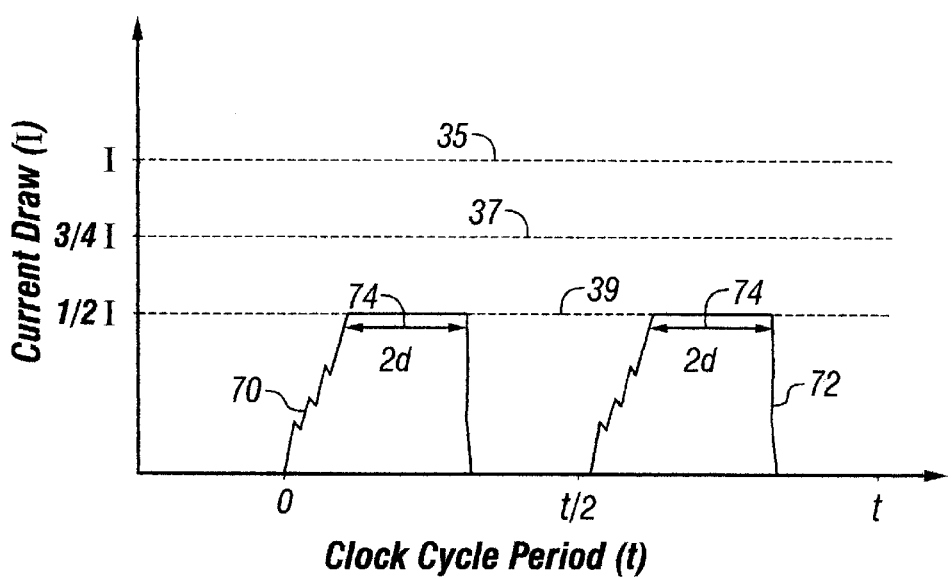
FIG. 11 shows a graph of current draw during a clock cycle period of the embodiments of the present invention shown in FIGS. 6–10.

FIG. 11 shows a graph of current draw during a clock cycle period of the rising edge and falling edge noise reduction circuits as shown in FIGS. 6–10. In both circuits, the results in reducing the current draw during the clock signal switching are similar. Specifically, the graph of FIG. 11 is set up on the same scale as the graph of the prior art performance shown in FIG. 4. The value "I" 35 represents the full value of a current draw. The value "¾ I" 37 represents 75% of the full value while the value "½ I" 39 represents 50% of the full value. The first current draw of the graph 70 represents the draw that results from the leading edge of a clock cycle (at clock cycle =0). The second current draw 72 represents the draw that results from the falling edge of the clock cycle (at clock cycle =t/2). As shown, the leading edge draw 70 and the trailing edge draw 72 are both at about 50% (½ I) 39 of the full current draw. This represents a substantial improvement in noise reduction by reducing the peak current draw. Each current draw 70, 72 has a duration ("2d") 74 that is approximately twice as long as the corresponding duration ("d") of the prior art current draws 41, 43 shown in FIG. 4.

All of the described circuits produce a pulse that controls the switching of the capacitors (through the NAND or NOR gates and the inverters on the other input). The pulse causes the capacitors to go into series when the latches are switching and the extra charge could be used. The pulse goes away after the latches have switched causing the capacitors to go back to parallel and subsequently pull charge back into the capacitors. The net result is a longer current spike but with a smaller magnitude and consequently, less noise.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for reducing noise of a clock signal for a latch-based circuit, comprising:

storing a charge upon receipt of a first signal; and dumping the charge onto a system power grid upon receipt of a second signal, wherein storing the charge and dumping the charge are synchronized with the operation of at least one latch.

2. The method of claim 1, wherein the first signal is a rising edge clock signal.

3. The method of claim 1, wherein the first signal is a falling edge clock signal.

4. The method of claim 1, wherein the second signal is a rising edge clock signal.

5. The method of claim 1, wherein the second signal is a falling edge clock signal.

6. The method of claim 1, wherein storing the charge and dumping the charge are conducted within one clock cycle.

7. A method for reducing noise of a clock signal for a latch-based circuit, comprising:

step of storing a charge upon receipt of a first signal;

step of dumping the charge onto a system power grid upon receipt of a second signal; and step of synchronizing storing the charge and dumping the charge with the operation of at least one latch.

8. A method for improving noise reduction by reducing peak current draw in a latch-based circuit, comprising:

inputting a clock signal;

buffering the clock signal;

storing charge upon receipt of a first transition of the clock signal;

dumping charge onto a power grid upon receipt of a second transition of the clock signal; and latching a value of the clock signal, wherein the buffering and latching is synchronized with the storing and dumping.

9. The method of claim 8, wherein the storing and dumping occur between the first transition and the second transition.

* * * * *